United States Patent
Fornara et al.

(10) Patent No.: US 9,780,045 B2
(45) Date of Patent: Oct. 3, 2017

(54) METHOD FOR FABRICATION OF AN INTEGRATED CIRCUIT RENDERING A REVERSE ENGINEERING OF THE INTEGRATED CIRCUIT MORE DIFFICULT AND CORRESPONDING INTEGRATED CIRCUIT

(71) Applicant: STMicroelectronics (Rousset) SAS, Rousset (FR)

(72) Inventors: Pascal Fornara, Pourrieres (FR); Christian Rivero, Rousset (FR); Guilhem Bouton, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/466,396

(22) Filed: Mar. 22, 2017

(65) Prior Publication Data

US 2017/0194267 A1 Jul. 6, 2017

Related U.S. Application Data

(62) Division of application No. 14/829,292, filed on Aug. 18, 2015, now Pat. No. 9,640,493.

(30) Foreign Application Priority Data

Aug. 29, 2014 (FR) .................... 14 58099

(51) Int. Cl.
*H01L 23/00* (2006.01)
*H01L 27/02* (2006.01)
*H01L 21/768* (2006.01)

(52) U.S. Cl.
CPC ...... *H01L 23/576* (2013.01); *H01L 21/76838* (2013.01); *H01L 27/0203* (2013.01)

(58) Field of Classification Search
CPC ..... H01L 23/528; H01L 23/57; H01L 23/573; H01L 27/0203; H01L 27/0207
See application file for complete search history.

(56) References Cited

U.S. PATENT DOCUMENTS

| 4,392,210 A | 7/1983 | Chan |
| 5,780,332 A | 7/1998 | Ozaki |
| (Continued) | | |

FOREIGN PATENT DOCUMENTS

| DE | 102011001527 A1 | 12/2011 |
| EP | 0764985 A2 | 3/1997 |
| (Continued) | | |

OTHER PUBLICATIONS

INPI Search Report and Written Opinion for FR 1458099 dated Jun. 10, 2015 (8 pages).

(Continued)

*Primary Examiner* — Cuong Q Nguyen
(74) *Attorney, Agent, or Firm* — Gardere Wynne Sewell LLP (57) ABSTRACT

An integrated circuit includes a substrate with several functional blocks formed thereon. At least two identical functional blocks are respectively disposed at two or more different locations on the integrated circuit. Electrically inactive dummy modules in the neighborhoods and/or inside of the functional blocks are provided, wherein at least two different electrically inactive dummy modules are includes in the respective neighborhoods and/or inside of the at least two identical functional blocks.

22 Claims, 12 Drawing Sheets (56) References Cited

U.S. PATENT DOCUMENTS

| | | |
|---|---|---|
| 5,913,125 A | 6/1999 | Brouillette et al. |
| 6,218,693 B1 | 4/2001 | Lu |
| 6,407,898 B1 | 6/2002 | Wu |
| 6,492,244 B1 | 12/2002 | Christensen et al. |
| 7,755,163 B2 | 7/2010 | Ogawa |
| 7,948,028 B2 | 5/2011 | Renn |
| 7,968,929 B2 | 6/2011 | Chinthakindi et al. |
| 8,372,742 B2 | 2/2013 | Cheng et al. |
| 8,524,556 B1 | 9/2013 | Chiou et al. |
| 8,766,322 B2 * | 7/2014 | Okamoto ............ H01L 27/0207 257/206 |
| 8,779,526 B2 | 7/2014 | Hsu et al. |
| 8,847,319 B2 | 9/2014 | Liu et al. |
| 9,263,518 B2 | 2/2016 | Rivero et al. |
| 9,269,771 B2 | 2/2016 | Rivero et al. |
| 2004/0022102 A1 | 2/2004 | Liang et al. |
| 2004/0038492 A1 | 2/2004 | Okazaki et al. |
| 2004/0099912 A1 | 5/2004 | Chow et al. |
| 2005/0139887 A1 | 6/2005 | Song |
| 2005/0151183 A1 | 7/2005 | Tu |
| 2005/0285137 A1 | 12/2005 | Satoh |
| 2006/0014340 A1 | 1/2006 | Matsumori |
| 2007/0001203 A1 | 1/2007 | Lehr et al. |
| 2007/0052013 A1 | 3/2007 | Kim et al. |
| 2007/0090417 A1 | 4/2007 | Kudo |
| 2007/0117306 A1 | 5/2007 | Oyamatsu |
| 2007/0132032 A1 | 6/2007 | Teo et al. |
| 2007/0145522 A1 | 6/2007 | Oishi |
| 2007/0278536 A1 | 12/2007 | Adachi |
| 2008/0017929 A1 | 1/2008 | Yi |
| 2008/0036012 A1 | 2/2008 | Yang et al. |
| 2008/0054413 A1 | 3/2008 | Dyer et al. |
| 2008/0079097 A1 | 4/2008 | Inokuma |
| 2008/0122002 A1 | 5/2008 | Pei et al. |
| 2008/0179638 A1 | 7/2008 | Dyer et al. |
| 2009/0001466 A1 | 1/2009 | Yang et al. |
| 2009/0039467 A1 | 2/2009 | Chinthakindi et al. |
| 2009/0079000 A1 | 3/2009 | Yamazaki et al. |
| 2009/0108463 A1 | 4/2009 | Pidin |
| 2009/0206414 A1 | 8/2009 | Sudo |
| 2009/0230439 A1 | 9/2009 | Wang et al. |
| 2009/0294986 A1 | 12/2009 | Yan et al. |
| 2009/0309163 A1 | 12/2009 | Wang et al. |
| 2010/0001369 A1 | 1/2010 | Chuang et al. |
| 2010/0022061 A1 | 1/2010 | Wu et al. |
| 2010/0044802 A1 | 2/2010 | Ishibashi et al. |
| 2010/0059823 A1 | 3/2010 | Chung et al. |
| 2010/0105188 A1 | 4/2010 | Moens et al. |
| 2010/0156510 A1 | 6/2010 | Botula et al. |
| 2010/0270623 A1 | 10/2010 | Kirimura et al. |
| 2010/0283093 A1 | 11/2010 | Pei et al. |
| 2010/0320509 A1 | 12/2010 | Knorr et al. |
| 2011/0081765 A1 | 4/2011 | Cummings et al. |
| 2011/0169065 A1 | 7/2011 | Cheng et al. |
| 2011/0169131 A1 | 7/2011 | Nakos et al. |
| 2011/0260294 A1 | 10/2011 | Oh |
| 2011/0318897 A1 | 12/2011 | Shang et al. |
| 2012/0256266 A1 | 10/2012 | Itou et al. |
| 2012/0267759 A1 | 10/2012 | Shroff et al. |
| 2013/0015531 A1 | 1/2013 | Kim et al. |
| 2013/0062680 A1 | 3/2013 | Kato et al. |
| 2013/0087861 A1 | 4/2013 | Chen et al. |
| 2013/0105912 A1 | 5/2013 | Hsu et al. |
| 2013/0270650 A1 | 10/2013 | Tseng et al. |
| 2013/0277754 A1 | 10/2013 | Liang et al. |
| 2014/0051222 A1 | 2/2014 | Terahara et al. |
| 2014/0131771 A1 | 5/2014 | Flachowsky et al. |
| 2014/0138793 A1 | 5/2014 | Chidambaram et al. |
| 2015/0129987 A1 | 5/2015 | Jeng et al. |
| 2015/0255540 A1 | 9/2015 | Bouton et al. |
| 2015/0270218 A1 * | 9/2015 | Becker ................ H01L 27/0207 257/369 |

FOREIGN PATENT DOCUMENTS

| | | |
|---|---|---|
| EP | 1858067 A1 | 11/2007 |
| JP | 2004165378 A | 6/2004 |
| WO | WO-2004038800 A2 | 5/2004 |

OTHER PUBLICATIONS

Gaetan Raymond: "Etude mecanique des films de nitrure de silicium fortementcontraints utilises pour augmenter les performances des transistors CMOS," Sep. 23, 2010, Extrait de l'Internet: URL: http://tel.archives-ouvertes.fr/docs/00/52/04/27/PDF/these_gaetan_Raymond.pdf, p. 9-p. 23.

* cited by examiner

METHOD FOR FABRICATION OF AN INTEGRATED CIRCUIT RENDERING A REVERSE ENGINEERING OF THE INTEGRATED CIRCUIT MORE DIFFICULT AND CORRESPONDING INTEGRATED CIRCUIT

CROSS REFERENCE TO RELATED APPLICATIONS

This application is a divisional application from U.S. patent application Ser. No. 14/829,292, filed Aug. 18, 2015, which claims priority from French Application for Patent No. 1458099 filed Aug. 29, 2014, the disclosures of which are incorporated by reference.

TECHNICAL FIELD

Various embodiments and their implementation relate to integrated circuits and, more particularly, to their fabrication with the aim of rendering a reverse engineering of the integrated circuit more difficult.

BACKGROUND

The reverse engineering of an integrated circuit consists in analyzing the integrated circuit in order to determine its internal structure and its operation with a view for example to copying and to re-fabricating.

A critical step in a process of reverse engineering is the recognition of the standard cells and of the various components by means of a pattern matching technique for the purpose of determining the list of interconnections and of components (or 'netlist') and potentially of reconstructing the hierarchy of the integrated circuit.

More precisely, once a cell or a component has been identified, all the identical instances of this cell or of this component within the integrated circuit are sought using the pattern matching technique.

Current solutions for attempting to counteract such a search are based on the error tolerance of such a pattern matching technique. More precisely, they are based on specific designs of cells providing very similar layouts for cells having different functionalities.

However, such solutions require the implementation of input and output stages with a conventional CMOS structure, hence prohibiting an output stage being equipped with a specific non-CMOS component with a view, for example, to carrying out a correct characterization over time, or else to obtaining a high input capacitance for the input stage.

SUMMARY

According to one embodiment and its implementation, the idea is to complicate as much as possible the pattern recognition step during a reverse engineering while at the same time not being limited to a conventional CMOS architecture for any input or output stages.

It is also advantageously provided for the topology of the integrated circuit to be modified in a manner that is automatic and transparent for the designer of the integrated circuit.

According to one aspect, a method for fabrication of an integrated circuit is provided, comprising the formation in and/or on the substrate of the integrated circuit with several functional blocks including at least two identical functional blocks respectively disposed at two or more different locations on the integrated circuit.

The method furthermore comprises respective formations, in the neighborhood and/or inside of the functional blocks, of electrically inactive dummy modules, and respective formations, in the neighborhood and/or inside of the at least two identical functional blocks, of at least two different electrically inactive dummy modules.

The functional blocks comprise for example standard cells (for example inverters, logic gates, etc.) and/or groups of standard cells or else specific devices such as for example ring oscillators designed around CMOS inverters.

When the functional blocks are standard cells, the dummy modules are advantageously formed in the neighborhood of these standard cells. Thus, the topology of the standard cells is not modified.

When the functional blocks are groups of dummy cells or else a specific device, such as a ring oscillator, the dummy module or modules may be formed in the neighborhood and/or inside of these groups or device.

In practice, dummy modules will be formed in the external neighborhood and/or inside of the major part or even of the totality of the functional blocks depending on the available space.

In contrast to the solutions of the prior art, two identical functional blocks, in particular two identical standard cells, disposed at different locations, preserve an identical functional topology but have different electrically inactive dummy environments. This allows the pattern recognition by the aforementioned matching technique to be rendered more complex while at the same time not requiring any modification of the topology of the libraries of existing standard cells, in particular.

Furthermore, the definition and the placement of the dummy modules are advantageously carried out automatically after the placement of the various functional blocks, for example in a transparent manner for the designer of the integrated circuit during the generation of at least one photolithography mask taking into account a set of pre-established rules.

Thus, these definitions and placements of the dummy modules are carried out in a transparent manner for the designer of the integrated circuit, whether these dummy modules are disposed in the neighborhood of the standard cells or else inside of a group of standard cells forming a specific device.

The dummy module or modules may be formed at various levels (substrate, polysilicon, contact levels, etc.) and/or may take various forms (dummy active region, dummy polysilicon region, dummy contacts on dummy active regions and/or on dummy polysilicon region, etc.) or with a combination of these various criteria, without this being limiting.

Thus, according to one embodiment in which the at least two identical functional blocks each comprise an active region within the substrate bounded by an insulating region, the formation of at least one dummy module comprises the formation of a dummy active region in the insulating region bounding the corresponding active region.

When each of the at least two identical functional blocks comprise, within their respective neighborhood, a dummy active region, the two dummy active regions may for example have different geometries.

In these embodiments, the definition of each dummy active region is advantageously carried out during the generation of the mask for definition of the active regions of the integrated circuit.

According to another possible embodiment in which the two identical functional blocks each comprise an active region within the substrate bounded by an insulating region, the formation of at least one dummy module can comprise the formation of at least one dummy polysilicon region, at least in part, on top of the insulating region bounding the corresponding active region.

Here again, when each of the at least two identical functional blocks comprise, in their respective neighborhood, at least one dummy polysilicon region, the two dummy polysilicon regions may have different geometries.

It is also possible for the at least one dummy polysilicon region to extend, at least in part, over a dummy active region.

In these embodiments, the definition of each dummy polysilicon region is advantageously carried out during the generation of the mask referred to as "poly mask".

According to yet another possible embodiment, the formation of the at least one dummy module may comprise at least one electrically conducting dummy contact on top of the dummy active region and/or on top of the dummy polysilicon region.

The definition of each electrically conducting dummy contact is advantageously carried out during the generation of the mask referred to as "contacts mask".

The set of pre-established rules used for the definition and the placement of the electrically inactive dummy modules contains for example the design rules in the technology used (known by those skilled in the art under the acronym DRM: Design Rules Manual), or else these design rules in part or even totally relaxed, where this is possible.

Although it is in theory possible to adopt a different dummy module at each instance of a functional block at one location on the integrated circuit, it is simpler, according to one embodiment, to define different areas of the integrated circuit respectively containing identical functional blocks, to assign different sets of rules to the areas, and to carry out the definition and the placement of the dummy modules within each area taking into account the set of rules assigned to the area.

According to another aspect, an integrated circuit is provided, comprising, in and/or on a substrate, several functional blocks including at least two identical functional blocks respectively disposed at at least two different locations on the integrated circuit.

The integrated circuit furthermore comprises electrically inactive dummy modules in the neighborhood and/or inside of the functional blocks and at least two different electrically inactive dummy modules in the respective neighborhoods and/or inside of the at least two identical functional blocks.

According to one embodiment in which the at least two identical functional blocks each comprise an active region within the substrate bounded by an insulating region, the at least one dummy module comprises a dummy active region situated within the insulating region bounding the corresponding active region.

According to one embodiment in which each of the at least two identical functional blocks comprise in their respective neighborhood a dummy active region, the two dummy active regions have different geometries.

According to one embodiment in which the two identical functional blocks each comprise an active region in the substrate bounded by an insulating region, at least one dummy module comprises at least one dummy polysilicon region situated, at least in part, on top of the insulating region bounding the corresponding active region.

According to one embodiment in which each of the at least two identical functional blocks comprise, in their respective neighborhoods, at least one dummy polysilicon region, the two dummy polysilicon regions have different geometries.

The at least one dummy polysilicon region can extend, at least in part, over the corresponding dummy active region.

According to one embodiment, the at least one dummy module comprises at least one electrically conducting dummy contact situated on top of the dummy active region and/or on top of the dummy polysilicon region.

According to one embodiment, the integrated circuit comprises different areas respectively containing identical functional blocks, and within each area the dummy module or modules associated with each identical functional block are identical but are different from one area to another.

BRIEF DESCRIPTION OF THE DRAWINGS

Other advantages and features of the invention will become apparent upon examining the detailed description of non-limiting embodiments of the invention and their implementation, and the appended drawings in which.

DETAILED DESCRIPTION

Figure 1:
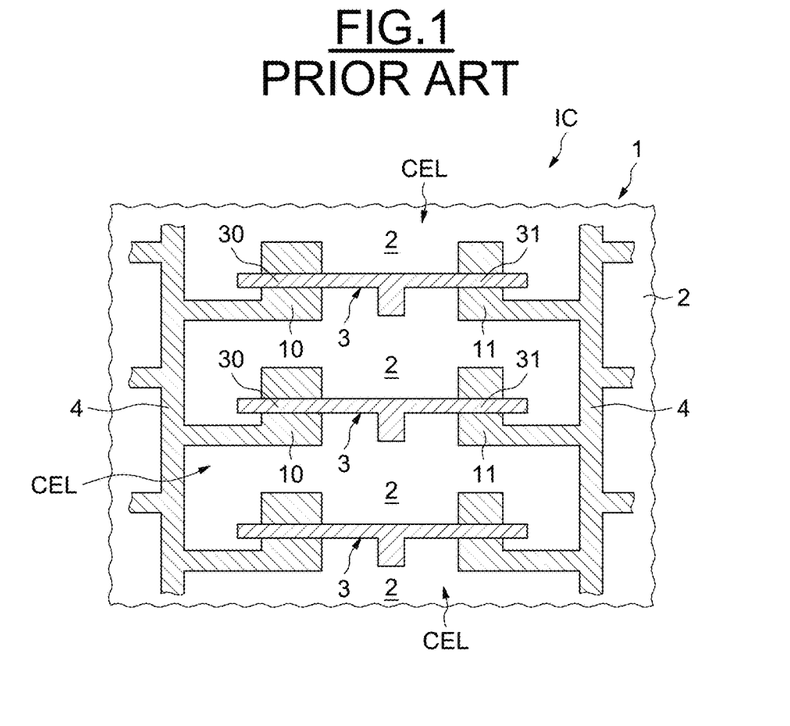
FIGS. 1, 7 and 10 illustrate examples of topologies according to the prior art.

In FIG. 1, the reference 1 denotes an extract from a layout of an integrated circuit IC.

In this example, the layout comprises three identical pre-characterized cells CEL. Each cell CEL here is a CMOS inverter comprising an NMOS transistor and a PMOS transistor.

More precisely, the cells are formed within a semiconductor substrate and are limited by an insulating region 2, for example of the shallow trench isolation (or STI) type.

The cell CEL comprises an active semiconductor area limited by the insulating region 2 and comprising a first active region 10 for a first MOS transistor of the inverter (source, channel and drain regions) and a second active region 11 for the second MOS transistor of the inverter.

The cell CEL also comprises a region of polysilicon 3 forming the gate regions of the two transistors MOS and comprising a part 30 situated on top of the channel region of the first MOS transistor while being electrically insulated by a gate oxide, together with a part 31 situated on top of the channel region of the second MOS transistor while being electrically insulated by a gate oxide.

The two active regions 10 and 11 are connected to two semiconductor rails 4 designed to be biased by power supply voltages (ground and the power supply voltage).

Figure 2:
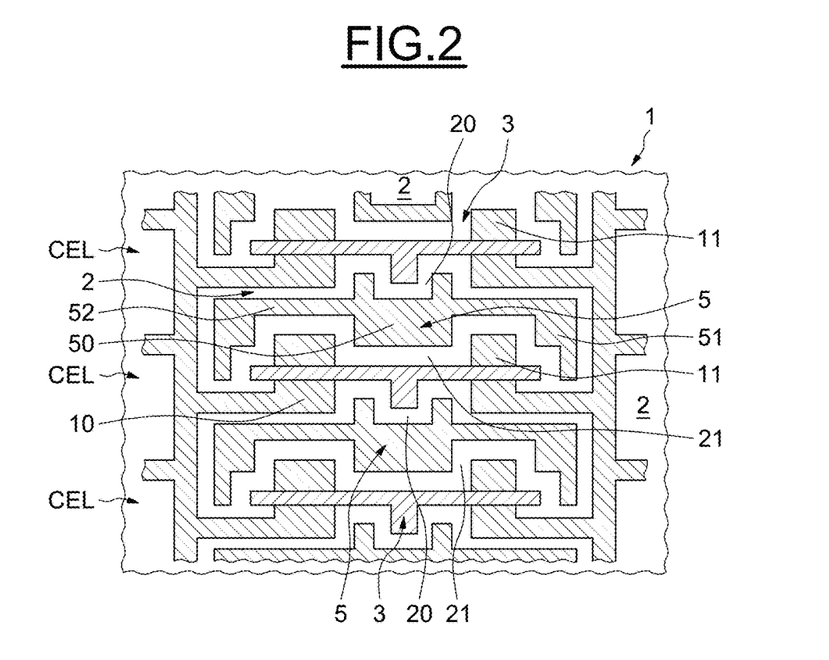
FIGS. 2-6, 8, 9 and 11-14 illustrate schematically various embodiments and their implementations.

FIG. 2 illustrates a first embodiment including a modification of the environment of the cells CEL by the addition of an electrically inactive dummy module in the external neighborhood of the cell.

More precisely, in this embodiment, the dummy module comprises, on either side of the cell CEL, a dummy active region 5 formed within the insulating region 2. This dummy active region here is a part of the semiconductor substrate which forms an "active wall" going up through the insulating region 2 to come out on the upper face of the substrate and locally separating the insulating region into at least two insulating areas 20 and 21. Furthermore, although this dummy active region has the same bias as the substrate, here it is electrically inactive because it is not connected to any other component of the integrated circuit.

It should be noted that the dummy active region may potentially comprise two parts of different conductivity (N and P) if the underlying substrate comprises wells of different conductivity (N and P). Although such a configuration is possible for the dummy active region, it can generate leakage currents. Accordingly, it is preferable in this case to divide the dummy active region into two distinct parts N and P mutually separated by a distance fixed by the design rules defining the separation to be adhered to between two regions N and P.

Generally speaking, irrespective of the embodiment, the dummy module advantageously comprises polygons.

In the example described here, this dummy active region 5 comprises a full rectangular central part 50 from where two wings 51 and 52 come out.

Figure 3:
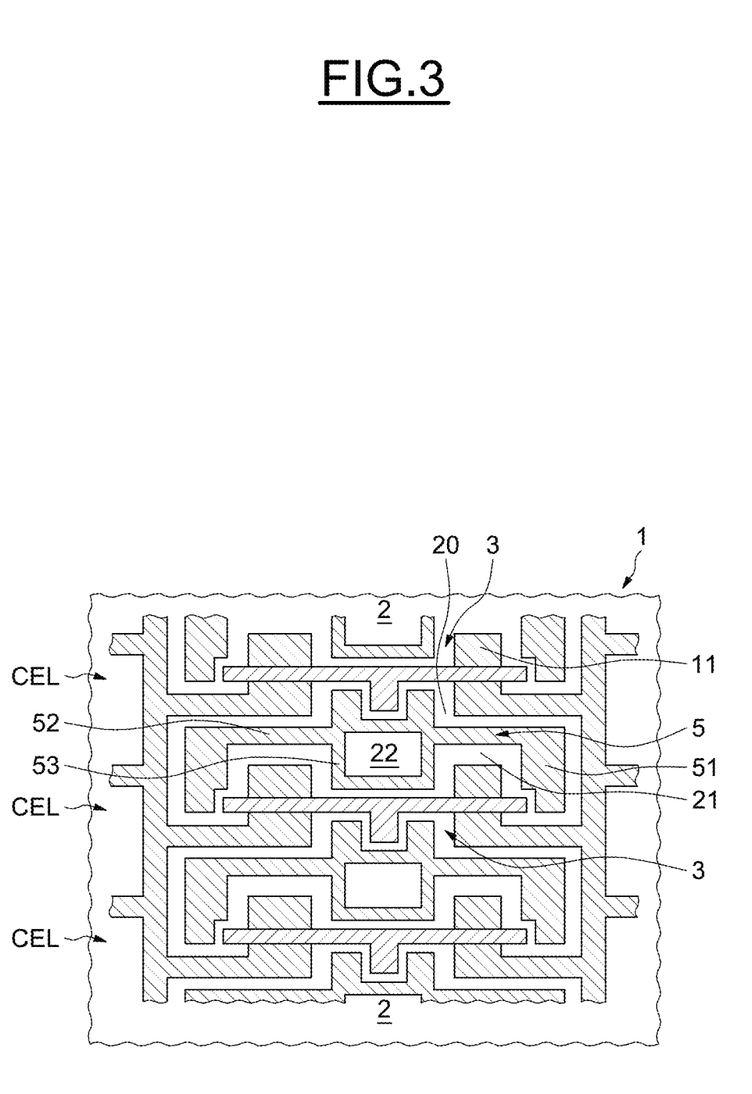

In the embodiment illustrated in FIG. 3, the dummy module 5, which is here again a dummy active region, has a different polygonal geometry from the geometry of the module 5 in FIG. 2. More precisely, the module 5 in FIG. 3 differs from the module 5 in FIG. 2 notably by the fact that the central part 53 here is hollowed out to leave behind an insulating island 22. Furthermore, the geometry of the wings 51 and 52 is slightly different and the gap between the module 5 and the regions of polysilicon 3 of the adjacent cells CEL is smaller in FIG. 3 than in FIG. 2.

This is explained by the fact that the set of rules used for the formation of the module 5 in FIG. 2 differs from that used for the formation of the module 5 of FIG. 3.

Figure 4:
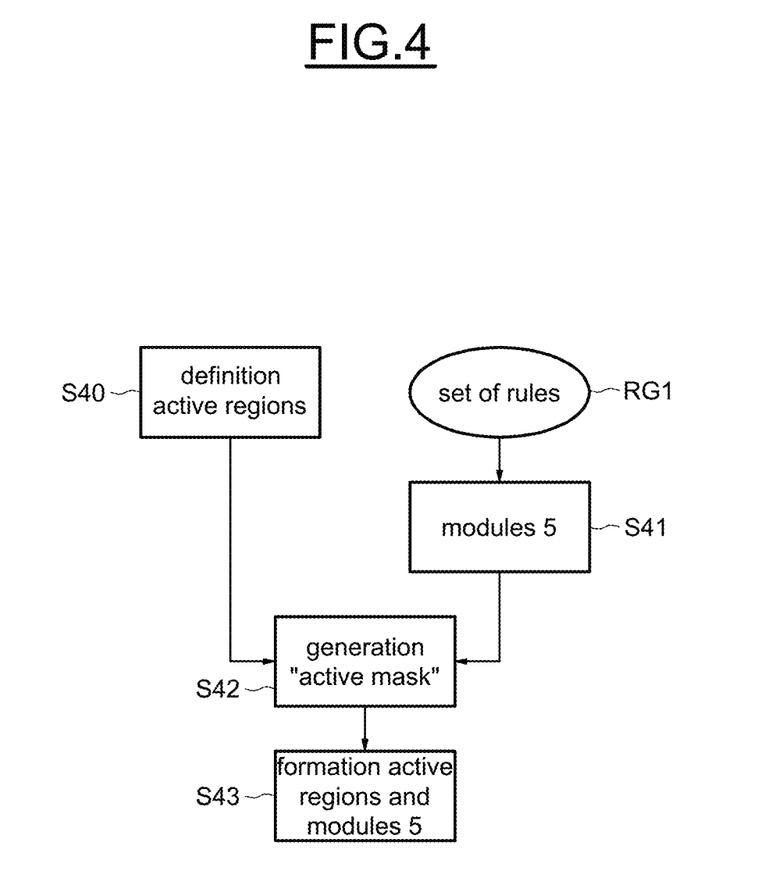

Indeed, as illustrated schematically in FIG. 4, the definition of the modules 5 is carried out based on a set of rules RG1 which can comprise the design rules (DRM) in the technology used and/or these design rules, at least in part, relaxed.

Thus, the minimum distance allowed between two active regions and the minimum distance allowed between an active region and a region of polysilicon, together with the width of the active region, will notably be taken into account in this set of rules RG1.

More precisely, in the case of FIG. 2, the rules used comprise the compliance with the minimum distance fixed by the DRM between two active regions, i.e. 140 nm for a 90 nm technology, and the compliance with a minimum distance of 140 nm between an active region and a region of polysilicon which corresponds, for the latter value, to a relaxing of the rule fixed by the DRM (which fixes a minimum distance of 50 nm for the 90 nm technology).

In the case of FIG. 3, the rules used comprise the compliance with the minimum distance fixed by the DRM between two active regions, i.e. 140 nm for a 90 nm technology, and the compliance with the minimum distance fixed by the DRM between an active region and a region of polysilicon, i.e. 50 nm for the 90 nm technology.

If reference is now once more made to FIG. 4, it can be seen that the definition of the active regions of the integrated circuits is carried out in a conventional manner in a step S40 by the designer of the integrated circuit when he/she carries out the placement of the various functional blocks of the integrated circuit, in particular of the pre-characterized cells.

Following this placement of the various functional blocks, the dummy modules 5 are defined in the step S41 based on the set of rules RG1, and this is carried out advantageously automatically by software using the set of rules.

The photolithography mask, referred to as "active mask" or "active region mask", is then generated (step S42) and the active regions and the dummy modules are then formed simultaneously using this mask (step S43).

More precisely, a bilayer (oxide of silicon/nitride of silicon) is deposited on the substrate, covered with a layer of photoresist which is exposed through the active region mask and which will allow the determination of the contours of the insulating region 2 and of the insulating areas 20, 21 and potentially 22 and, as a consequence, those of the active regions 10 and 11 and of the dummy active region 5. Then, after development of the photoresist, an etch of the bilayer and of the substrate is carried out using the remaining part of the photoresist as a hard mask in such a manner as to obtain trenches which will be filled with insulating material so as, after chemical-mechanical polishing of the silicon oxide and removal of the silicon nitride, to form the insulating region 2 and the insulating areas 20 and 21 and potentially 22.

It will be noted that the contours of the insulating areas 20, 21 and potentially 22 are located inside of the contour of the insulating region 2, and it is the latter contour which is defined by the designer when he/she defines the dimensions of the active regions for the placement of the functional blocks. Consequently, providing additional trenches in this insulating region on the active mask is totally transparent for the designer and especially so given that the dummy active regions 5 are electrically inactive since, in particular, not connected to another component of the integrated circuit.

Although, in the embodiments that have just been described, the modules 5 are "walls of active regions", it would be possible to form these modules by etching the insulating region 2 and by filling the trenches thus etched with polysilicon.

Figure 5:
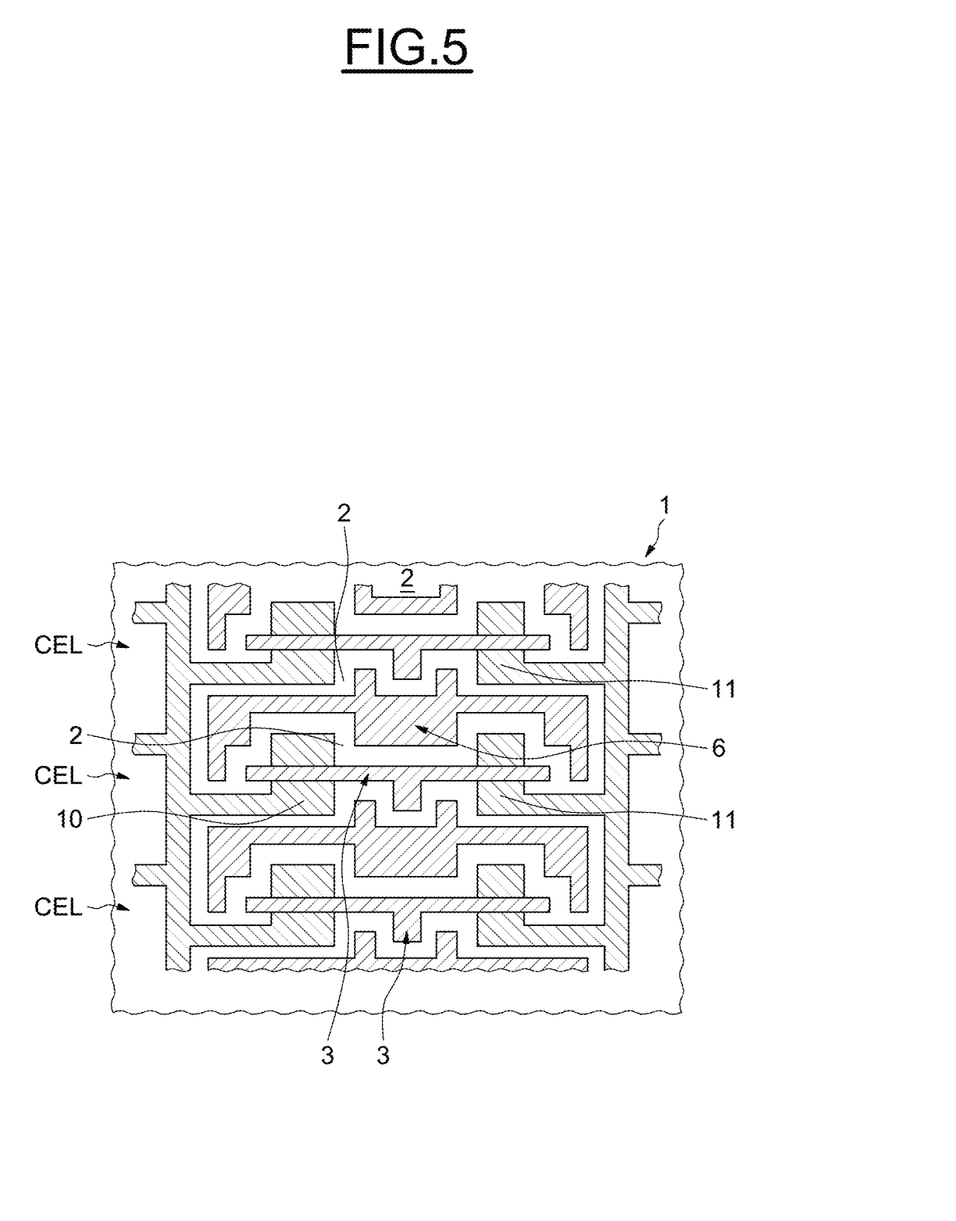

In the embodiment illustrated in FIG. 5, the dummy modules 6 are dummy polysilicon regions situated on top of the insulating region 2 also with a polygonal geometry.

Here again, the definition of the modules 6 is carried out based on a set of rules which can comprise the design rules (DRM) in the technology used and/or these design rules, at least in part, relaxed.

Thus, in this set of rules, the minimum distance allowed between two regions of polysilicon and the minimum distance allowed between an active region and a region of polysilicon, together with the width of the polysilicon line, will notably be taken into account.

More precisely, in the case of FIG. 5, the rules used comprise the compliance with the minimum distance fixed by the DRM between an active region and a region of polysilicon, i.e. 140 nm for a 90 nm technology, and the compliance with the minimum distance fixed by the DRM between two regions of polysilicon, i.e. 50 nm for a 90 nm technology.

Since the region of polysilicon is on top of the insulating region and unbiased or not connected to any other component, it is electrically inactive.

Figure 6:
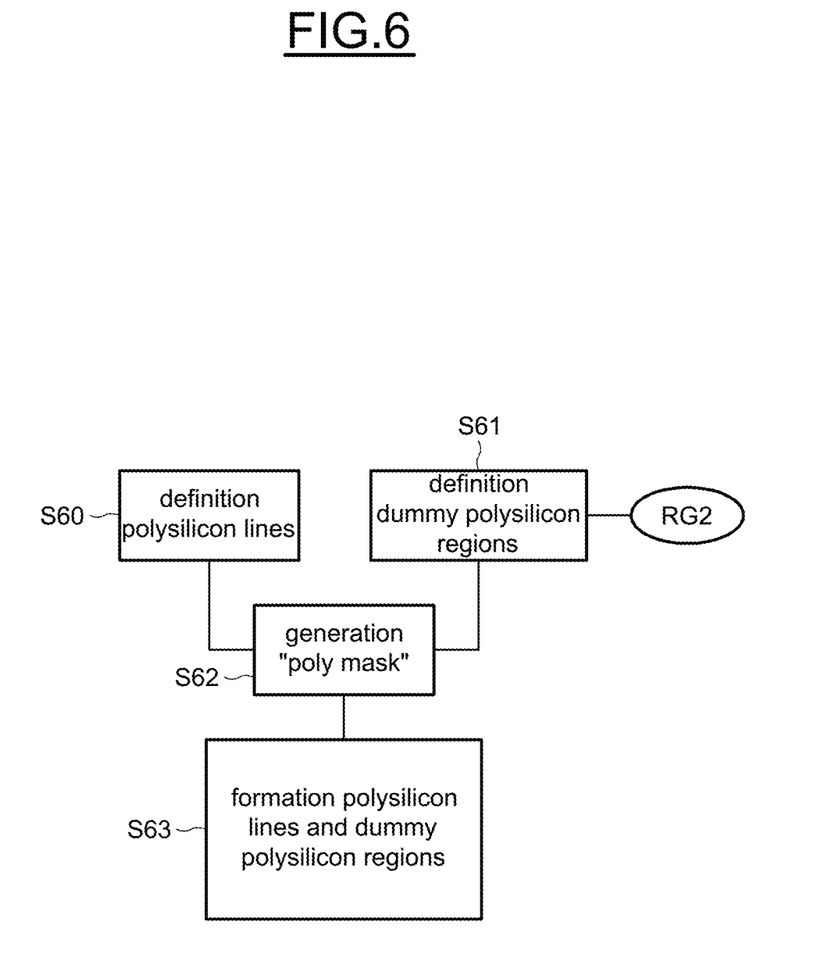

If reference is now made to FIG. 6, it can be seen that the definition of the functional lines of polysilicon of the integrated circuits is carried out in a conventional manner in a step S60 by the designer of the integrated circuit when he/she carries out the placement of the various functional blocks of the integrated circuit, in particular of the pre-characterized cells.

Following this placement of the various functional blocks, the dummy polysilicon regions 6 are defined in the step S61 based on the set of rules RG2, and this is carried out advantageously automatically by software using the set of rules.

The photolithography mask, referred to as "poly mask" is then generated (step S62) and the polysilicon lines and the dummy polysilicon regions are then formed simultaneously using this mask (step S63).

As a variant, it would be possible to form the dummy polysilicon regions, at least in part, on top of the dummy active regions while insulating the latter by a gate oxide and without connecting them to a bias voltage in order to avoid creating stray capacitances.

Figure 7:
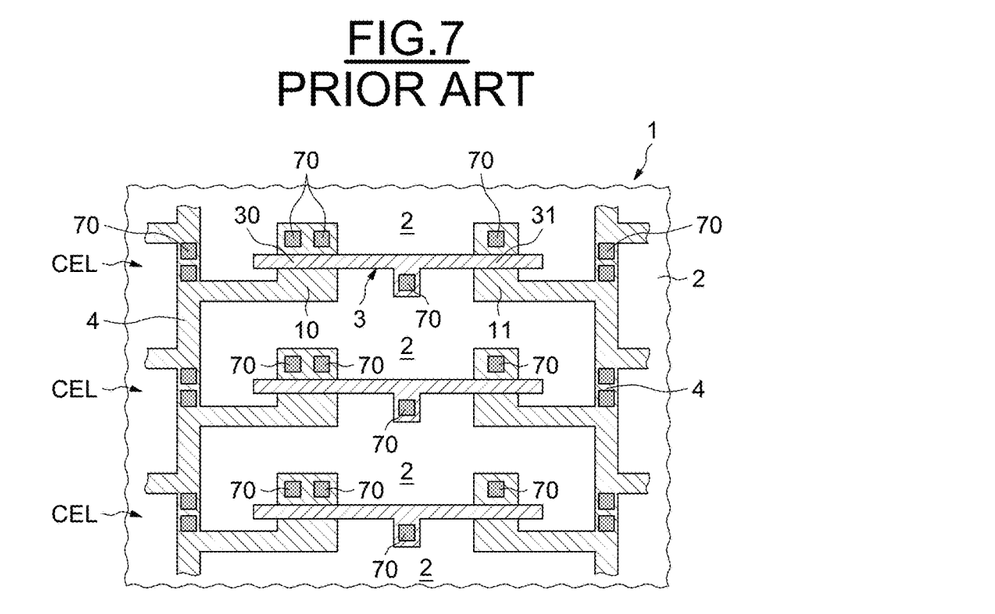

In FIG. 7, the reference 1 denotes the extract from the layout in FIG. 1, in which the electrically conducting contacts 70 on the active region, on the semiconductor rails 4 and on the regions of polysilicon 3 are shown.

Figure 8:
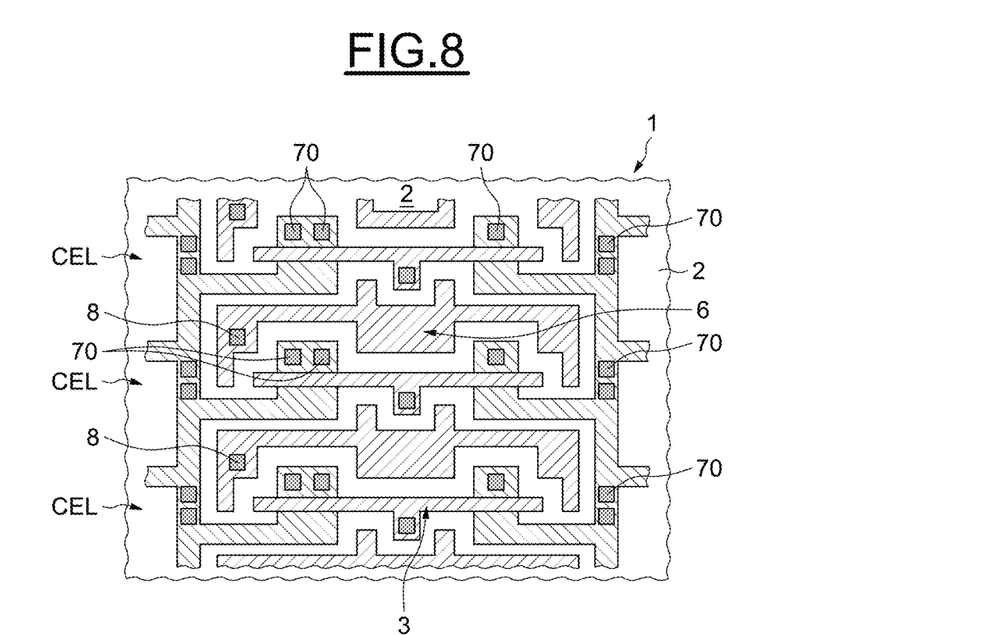

As illustrated in FIG. 8, the dummy modules can comprise electrically conducting dummy contacts 8 which are electrically inactive since not connected to any voltage or component of the integrated circuit. In FIG. 8, the dummy contacts 8 are situated on the dummy polysilicon regions 6. However, it would be possible to dispose at least a part of these dummy contacts on at least one dummy active region as long as this dummy contact is not in contact with a metal line of the first metal level, or if it is in contact with such a metal line, as long as this metal line is not itself connected to any other metal line.

Here again, the definition of the modules 8 is carried out based on a set of rules which can comprise the design rules (DRM) in the technology used and/or these design rules, at least in part, relaxed.

Thus, in this set of rules, the minimum distance allowed between a region of polysilicon and a contact and the minimum distance allowed between an active region and a contact will notably be taken into account.

Figure 9:
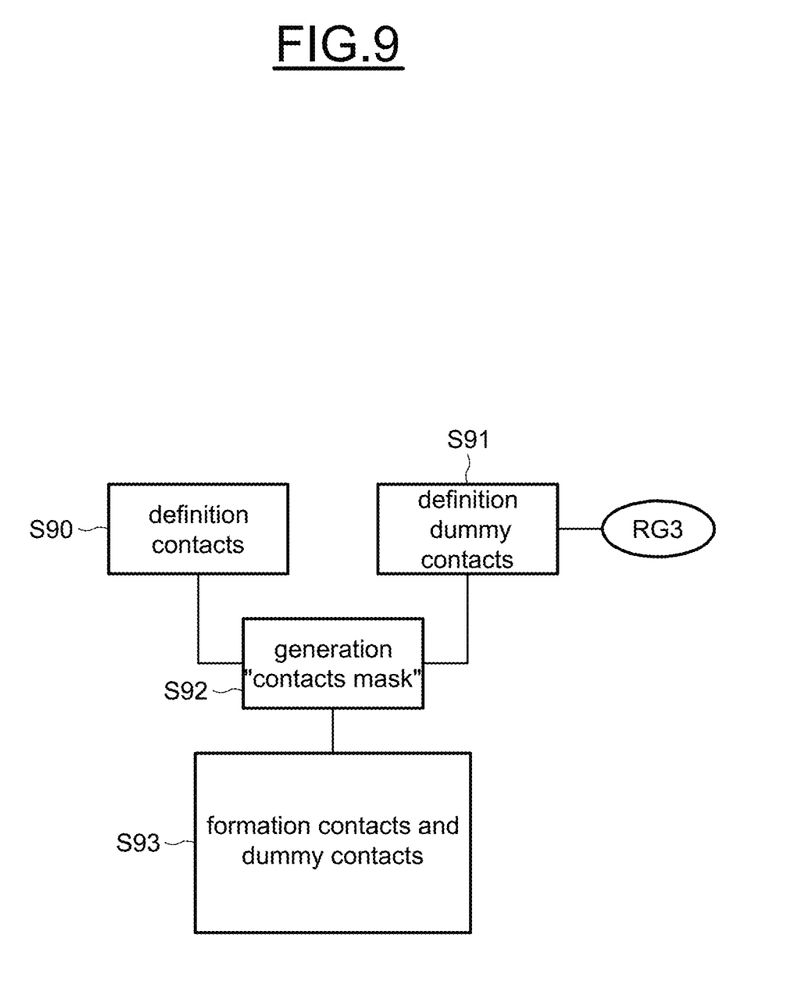

If reference is now made to FIG. 9, it can be seen that the definition of the electrically conducting functional contacts of the integrated circuit is carried out in a conventional manner in a step S90 by the designer of the integrated circuit when he/she carries out the placement of the various functional blocks of the integrated circuit, in particular of the pre-characterized cells.

Following this placement of the various functional blocks, dummy contacts 8 are defined in the step S91 based on the set of rules RG3, and this is carried out advantageously automatically by software using the set of rules.

The photolithography mask, referred to as "contacts mask" is then generated (step S92) and the functional and dummy contacts are then formed simultaneously using this mask (step S93).

Figure 10:
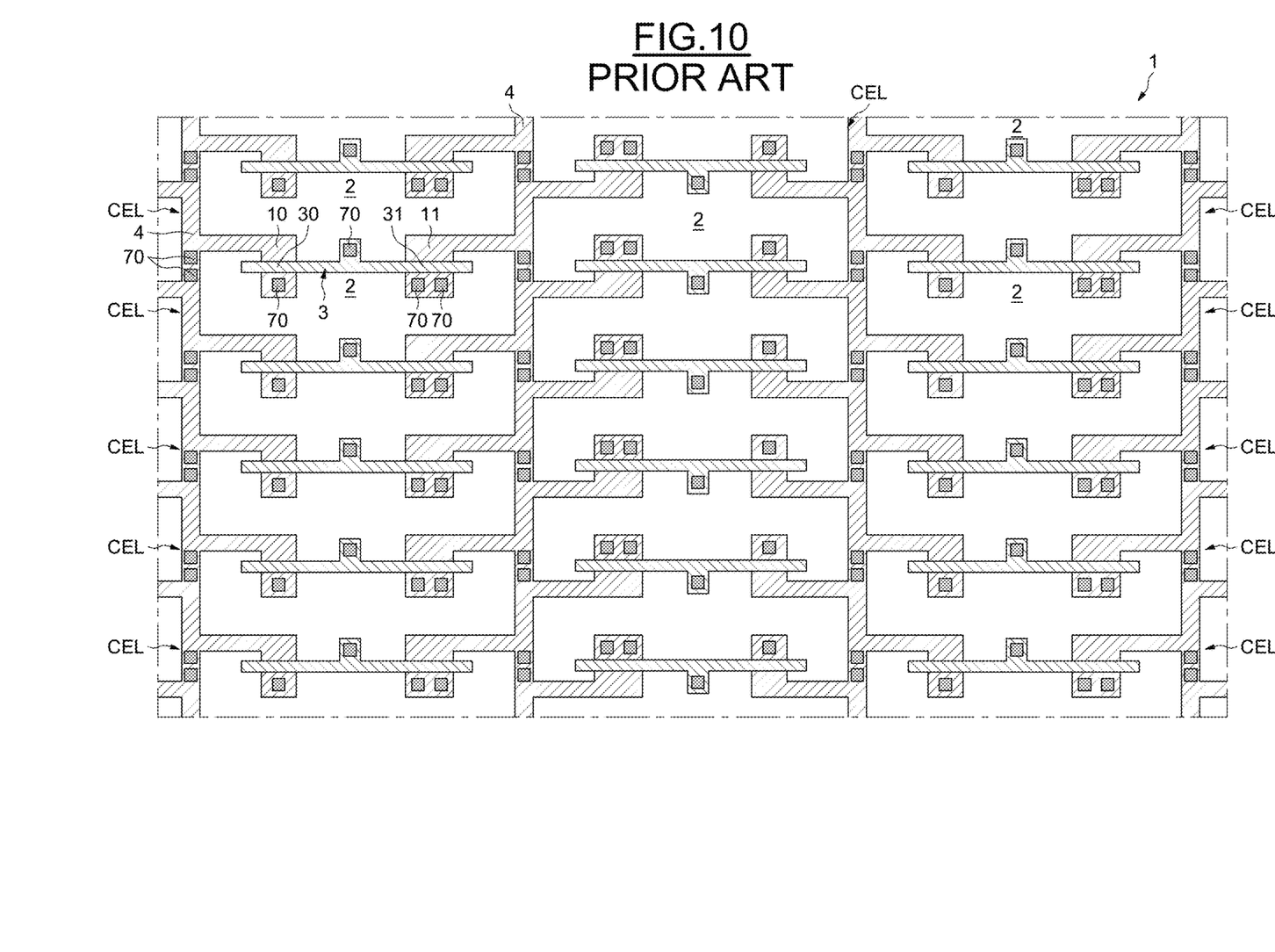

FIG. 10 illustrates an extract 1 from a layout of a ring oscillator comprising a plurality of pre-characterized cells CEL of the type of those illustrated in FIG. 7.

Figure 11:
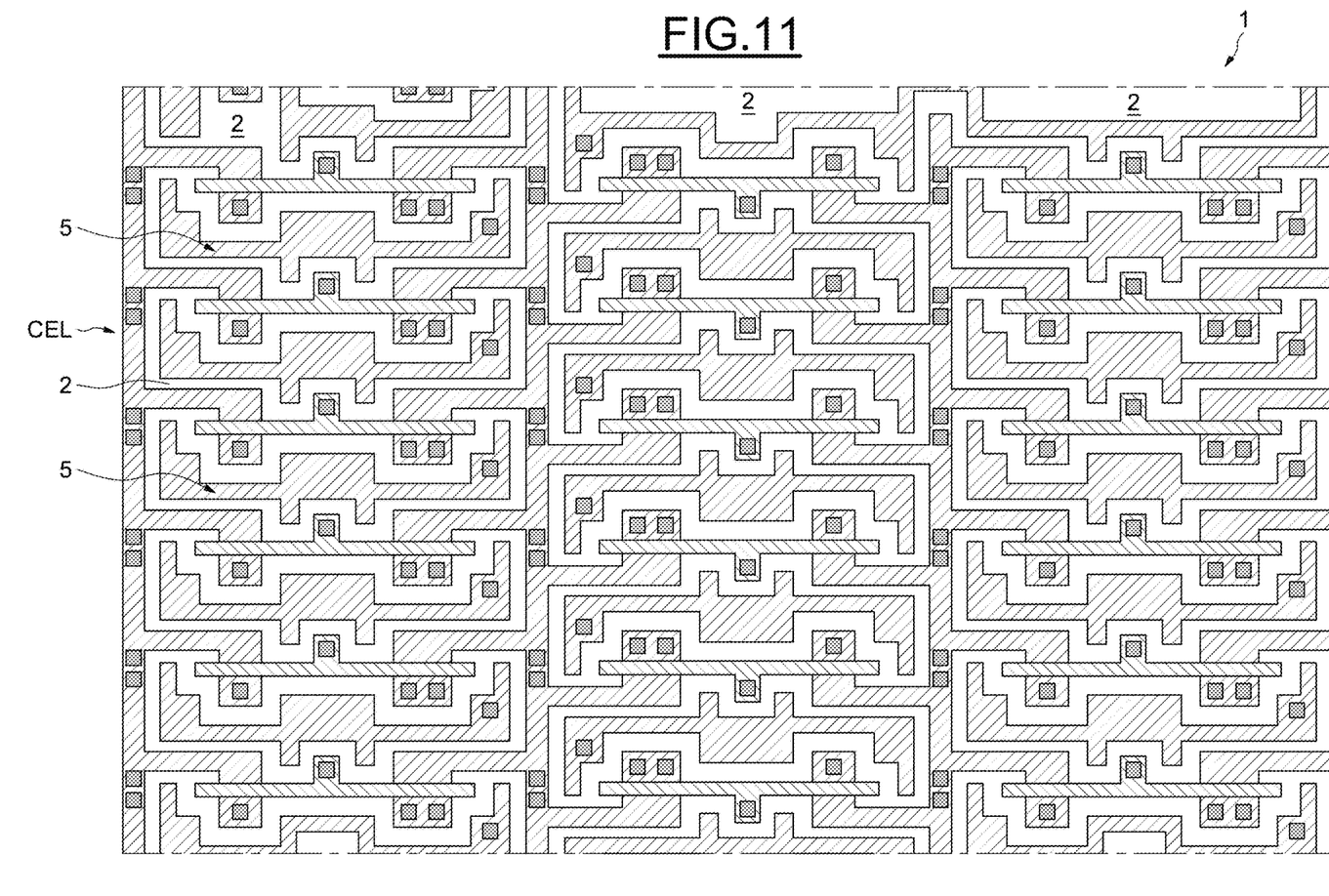

According to a first embodiment illustrated in FIG. 11, the layout is completed by dummy modules 5 of the type of those illustrated in FIG. 2 and situated inside of the ring oscillator and outside of the pre-characterized cells CEL.

Figure 12:
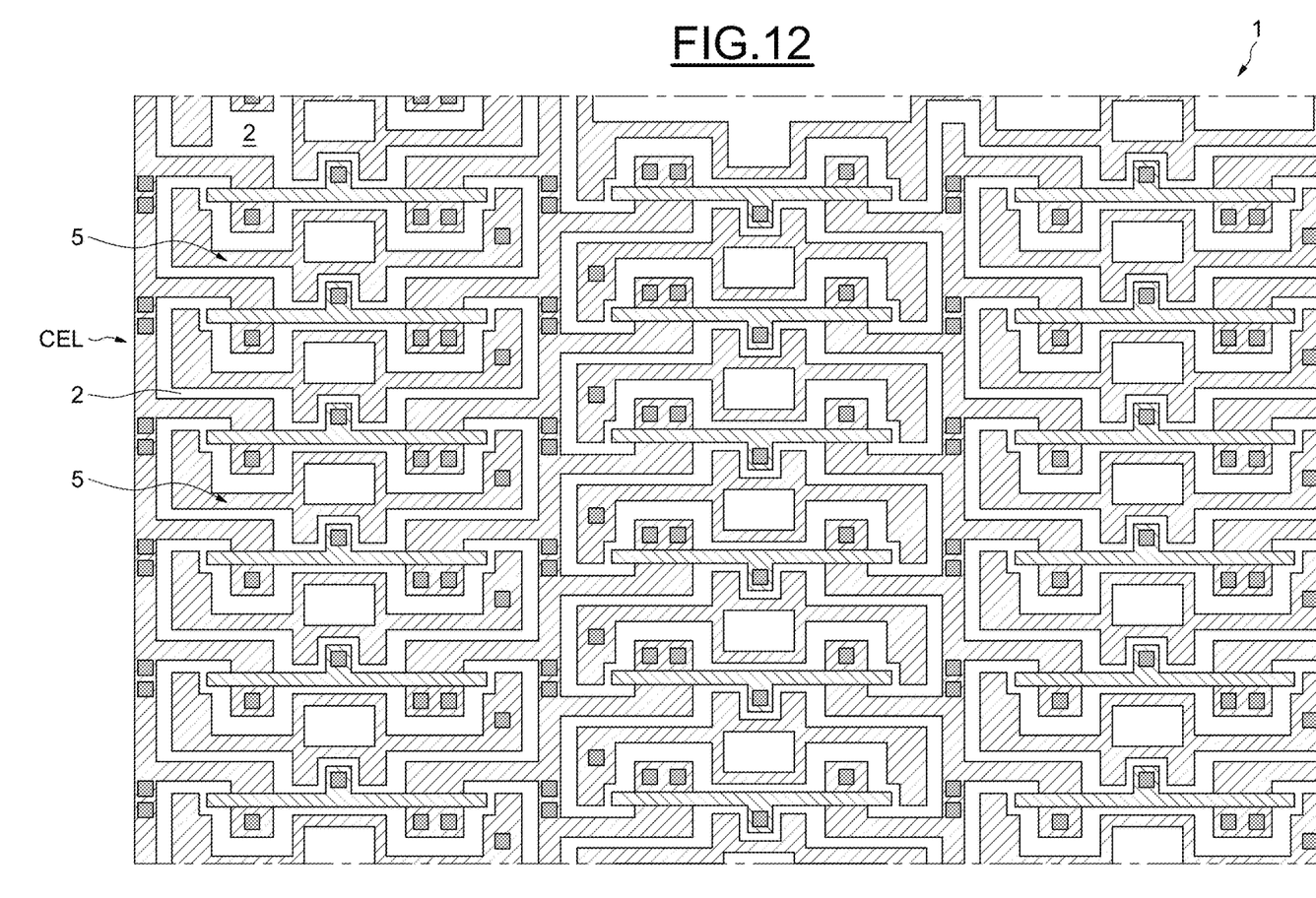

According to a second embodiment illustrated in FIG. 12, the layout is completed by dummy modules 5 of the type of those illustrated in FIG. 3 and situated inside of the ring oscillator and outside of the pre-characterized cells CEL.

Figure 13:
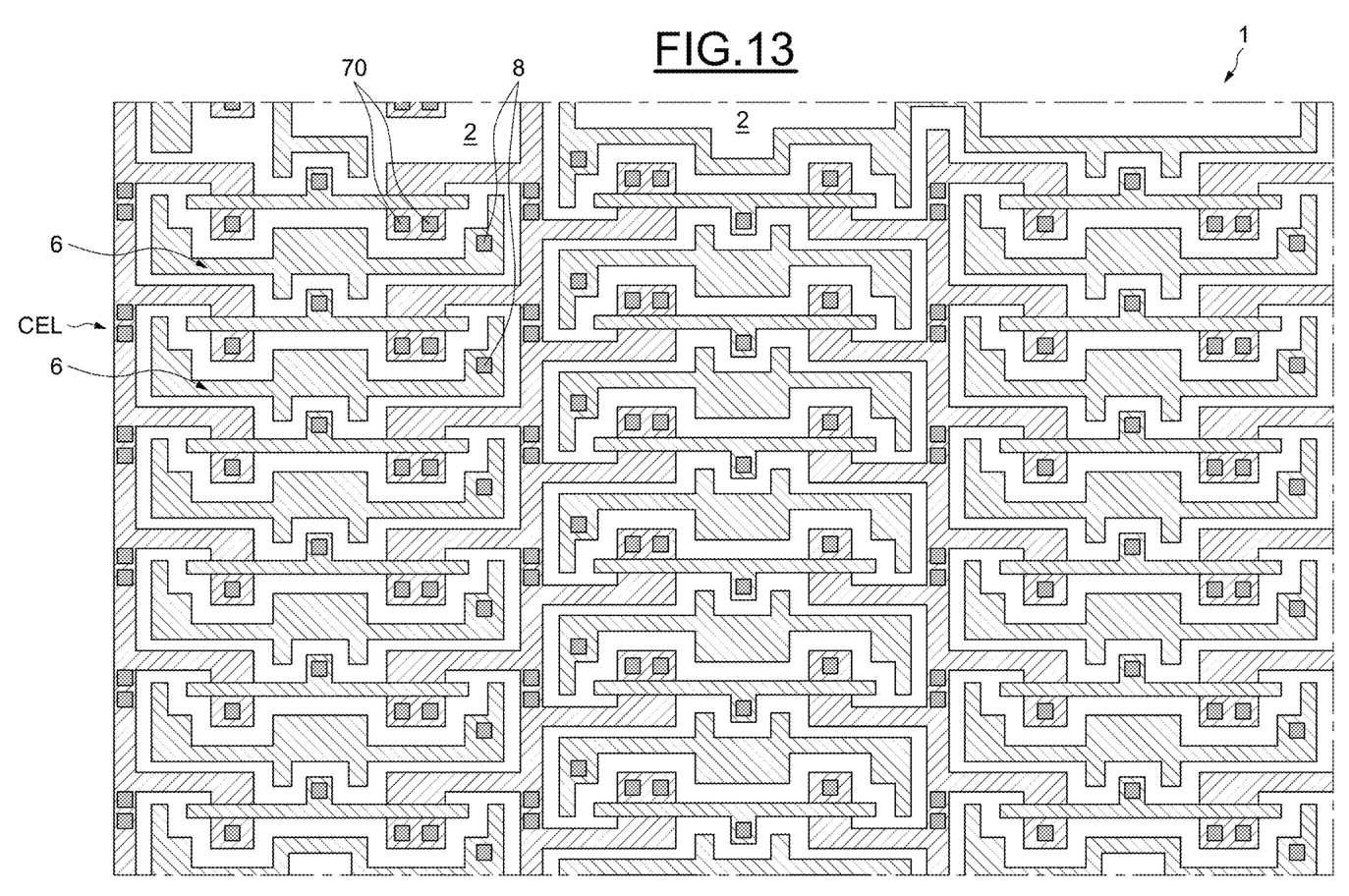

According to a third embodiment illustrated in FIG. 13, the layout is completed by dummy modules 6 and 8 of the type of those illustrated in FIG. 8 and situated inside of the ring oscillator and outside of the pre-characterized cells CEL.

In such a manner as to render the automatic recognition of patterns during a reverse engineering more difficult, it is advantageously envisaged to associate different dummy modules with at least some of the identical functional blocks of the integrated circuit disposed at various locations.

Although it is in theory possible to associate a different dummy module with each instance of the same functional block within the integrated circuit, it is easier to subdivide the layout of the integrated circuit into several areas and to use the same type of dummy module and/or to use the same set of rules within the same area but to use different types of dummy modules and/or to use different sets of rules within different areas.

Identical functional blocks are disposed in at least two different areas.

Of course, the higher the number of areas, the more difficult will be the automatic pattern recognition, but the more complex will be the fabrication of the integrated circuit.

Those skilled in the art will be able to find a good compromise with regard to number of areas depending notably on the size of the integrated circuit, on the number of identical functional blocks and on their locations.

Figure 14:
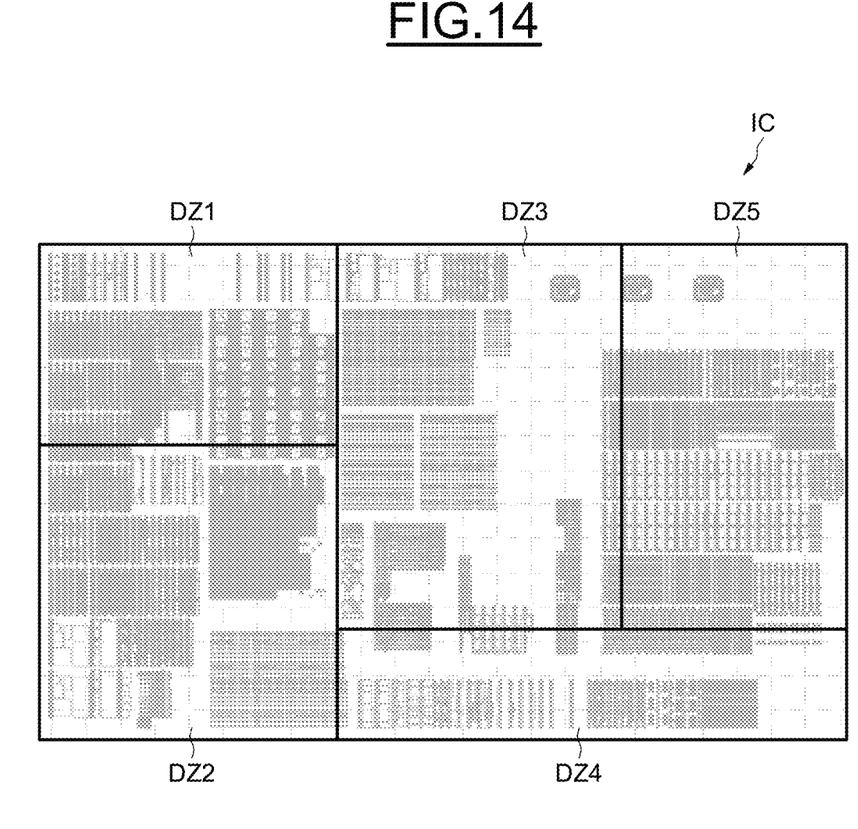

In FIG. 14, which illustrates one example of subdivision of an integrated circuit IC, the number of areas is equal to 5.

In practice, in order to enable the software for automatic definition of the dummy modules to differentiate the various areas DZ1-DZ5, a marker or identifier is assigned to each area, and with each identifier is associated the way in which the various dummy modules in the corresponding area are defined.

Thus, for example in the area DZ1 the dummy modules can be of the type of those illustrated in FIG. 2, whereas they can be of the type of those illustrated in FIG. 3 in the area DZ2.

The area DZ3 may for example contain dummy modules of the type of those illustrated in FIG. 5, and the area DZ4 contain dummy modules of the type of those illustrated in FIG. 8.

The area DZ5 may for example comprise a combination of at least some of the preceding dummy modules, and identical functional blocks are disposed in at least two different areas DZi.

Other variants of the invention are possible.

Thus, when several integrated circuits relating to the same product are fabricated on the same semiconductor, for the photolithography steps, a reticle is employed using which the photoresist can be exposed over a group of integrated circuits at the same time (the number of which depends on the number of rows and columns of the reticle). When a group of integrated circuits has been processed, the wafer is displaced relative to the reticle so as to process another group of integrated circuits and so on until the whole wafer has been processed.

It can then be envisaged, for example in combination with the use of the aforementioned markers, to modify the rules for obtaining dummy modules within a group of circuits on the same reticle, which allows functionally identical products to be finally obtained but with different configurations of dummy patterns within a group of products.

By way of example, with a reticule comprising 3 rows and 3 columns, there could be a row of a circuit type A, a row of a circuit type B and a row of a circuit type C; A, B and C corresponding for example to different rules for obtaining dummy modules. This allows the reverse engineering step to be rendered even more complex when two packaging units comprising circuits belonging to two different types are opened up.

Thus, according to another aspect, a method is also provided for fabrication of a wafer of integrated circuits individually fabricated according to the method defined hereinbefore, comprising a use of at least one reticle for exposing a photoresist covering a group of integrated circuits, a modification on the reticle, rules for obtaining dummy modules within the group of integrated circuits in such a manner as to obtain, within the group of integrated circuits, integrated circuits having different types of dummy modules, and successive displacements of the wafer so as to successively process all the groups of integrated circuits by means of the at least one reticle.

A wafer of integrated circuits is also provided such as defined hereinbefore relating to the same component or product and comprising identical groups of integrated circuits, each group comprising at least two integrated circuits having different configurations of dummy modules.

The invention claimed is:

1. An integrated circuit, comprising:
a substrate;
several functional blocks on the substrate including at least two identical functional blocks respectively disposed at two or more different locations on the integrated circuit;
electrically inactive dummy modules in a neighborhood of or inside of the functional blocks;
wherein at least two different electrically inactive dummy modules are in the respective neighborhoods of or inside of the at least two identical functional blocks.

2. The integrated circuit according to claim 1, wherein the at least two identical functional blocks each comprise an active region within the substrate bounded by an insulating region and the electrically inactive dummy modules comprise a dummy active region situated in the insulating region bounding the corresponding active region.

3. The integrated circuit according to claim 2, wherein each of the at least two identical functional blocks comprise, in their respective neighborhood, a dummy active region, the two dummy active regions having different geometries.

4. The integrated circuit according to claim 2, wherein the electrically inactive dummy modules comprise at least one dummy polysilicon region situated, at least in part, on top of the insulating region bounding the corresponding active region, and wherein the at least one dummy polysilicon region extends, at least in part, over the corresponding dummy active region.

5. The integrated circuit according to claim 4, wherein the electrically inactive dummy modules comprise at least one electrically conducting dummy contact situated on top of the dummy active region and/or on top of the dummy polysilicon region.

6. The integrated circuit according to claim 1, wherein the two identical functional blocks each comprise an active region within the substrate bounded by an insulating region and wherein the electrically inactive dummy modules comprise at least one dummy polysilicon region situated, at least in part, on top of the insulating region bounding the corresponding active region.

7. The integrated circuit according to claim 6, wherein each of the at least two identical functional blocks comprise, in their respective neighborhood, at least one dummy polysilicon region, the two dummy polysilicon regions having different geometries.

8. The integrated circuit according to claim 1, wherein the integrated circuit comprises various areas respectively containing identical functional blocks, and wherein each area the dummy module or modules associated with each identical functional block are identical but are different or of a different type from one area to another.

9. The integrated circuit according to claim 1, wherein the functional blocks comprise standard cells and the dummy modules associated with these standard cells are situated in the neighborhood of these standard cells.

10. An integrated circuit, comprising:
a substrate;
a first functional block on the substrate at a first location;
a second functional block on the substrate at a second location different from the first location;
wherein the first and second functional blocks are identical functional blocks;
a first electrically inactive dummy module in a neighborhood of or inside of the first functional block; and
a second electrically inactive dummy module in a neighborhood of or inside of the second functional block;
wherein first and second electrically inactive dummy modules are different electrically inactive dummy modules.

11. The integrated circuit according to claim 10, wherein each of the identical first and second functional blocks comprises an active region of the substrate bounded by an insulating region, and wherein the electrically inactive dummy module is a dummy active region within the insulating region.

12. The integrated circuit according to claim 11, wherein the dummy active regions for the first and second electrically inactive dummy modules have different geometries.

13. The integrated circuit according to claim 11, wherein the electrically inactive dummy modules comprise at least one dummy polysilicon region extending at least in part on top of the insulating region and further extending at least in part over the dummy active region.

14. The integrated circuit according to claim 13, further comprising defining each dummy polysilicon region when generating a mask for defining polysilicon areas of the integrated circuit.

15. The integrated circuit according to claim 13, further comprising at least one electrically conducting dummy contact on top of at least one of the dummy active region and the dummy polysilicon region.

16. The integrated circuit according to claim 10, wherein each of the identical first and second functional blocks comprises an active region of the substrate bounded by an insulating region, and wherein the electrically inactive dummy modules comprise at least one dummy polysilicon region that extends at least in part on top of the insulating region.

17. The integrated circuit according to claim 16, wherein the dummy polysilicon regions have different geometries.

18. The integrated circuit according to claim 10, wherein the first and second functional blocks comprise standard cells and wherein the electrically inactive dummy modules are formed adjacent to said standard cells.

19. The integrated circuit according to claim 10, wherein the first and second functional blocks each comprise an active region within the substrate bounded by an insulating region and wherein the first and second electrically inactive dummy modules each comprise a dummy active region situated in the insulating region bounding the corresponding active region.

20. The integrated circuit according to claim 10, wherein the first and second functional blocks each comprise a dummy active region, and wherein the dummy active regions for the first and second functional blocks have different geometries.

21. The integrated circuit according to claim 20, wherein the first and second electrically inactive dummy modules each comprise a dummy polysilicon region situated, at least in part, on top of the insulating region, and wherein the dummy polysilicon region extends, at least in part, over the dummy active region.

22. The integrated circuit according to claim 21, wherein the first and second electrically inactive dummy modules each comprise at least one electrically conducting dummy contact situated on top of at least one of the dummy active region and the dummy polysilicon region.

* * * * *